United States Patent [19]

Sasson et al.

[11] Patent Number: 5,016,107
[45] Date of Patent: May 14, 1991

[54] ELECTRONIC STILL CAMERA UTILIZING IMAGE COMPRESSION AND DIGITAL STORAGE

[75] Inventors: Steven J. Sasson, Hilton; Robert G. Hills, Spencerport, both of N.Y.

[73] Assignee: Eastman Kodak Company, Rochester, N.Y.

[21] Appl. No.: 349,566

[22] Filed: May 9, 1989

[51] Int. Cl.$^5$ .................... H04N 5/225; H04N 5/30
[52] U.S. Cl. ............................. 358/209; 358/909; 358/906; 358/961.3
[58] Field of Search ............ 358/479, 906, 909, 261.3, 358/427, 229, 335, 209; 360/32, 35.1

[56] References Cited

U.S. PATENT DOCUMENTS

| | | | |
|---|---|---|---|
| 4,130,834 | 12/1978 | Mender et al. | 358/127 |
| 4,131,919 | 12/1978 | Lloyd et al. | 358/134 |
| 4,302,776 | 11/1981 | Taylor et al. | |
| 4,420,773 | 12/1983 | Toyoda et al. | 358/335 |
| 4,456,931 | 6/1984 | Toyoda et al. | 558/335 |
| 4,489,351 | 12/1984 | d'Alayer de Costemore d'Are | 358/213 |
| 4,541,010 | 9/1985 | Alston | 358/44 |
| 4,571,627 | 2/1986 | Stempeck | 358/224 |
| 4,647,975 | 3/1987 | Alston et al. | 358/209 |
| 4,651,227 | 3/1987 | Yunoki et al. | 358/310 |
| 4,652,926 | 3/1987 | Withers et al. | 358/209 |
| 4,772,956 | 9/1988 | Roche et al. | 358/85 |
| 4,800,448 | 1/1989 | Kaneko et al. | 358/909 |
| 4,803,554 | 2/1989 | Pape | |
| 4,827,347 | 5/1989 | Bell | 358/906 |
| 4,858,028 | 8/1989 | Okino | 358/909 |
| 4,894,730 | 1/1990 | Yanagawa et al. | 358/473 |

FOREIGN PATENT DOCUMENTS 0204626 12/1986 European Pat. Off. .
0289944 11/1988 European Pat. Off. .
2089169 6/1988 United Kingdom .

OTHER PUBLICATIONS

Digital Still Video Camera Using Semiconductor Memory Card, Izawa et al., IEEE 1989, pp. 184–185.
Hashiguchi, Sumihisa, "Picture Recording and Electric Power Consumption" Shashim Kogyo, Apr. 1988, pp. 94–95.
Hashiguchi, Sumihisa, "Possibilities of the Digital Electronic Still Camera", Shashin Kogaku, Feb. 1988, pp. 110–111.
Prototype Announcement, Fijix DS-IP digital still camera, Fuji Photo Film Co., Sep. 20, 1988.
"Camera Uses $E^2$ PROM Film", Electronic Engineering Times, Apr. 10, 1989, p. 457.
"Ic Card Camera System-Toshiba & Fuji Photo Film" Dempa daily newspaper technical report, Mar. 20, 1989.
"Toshiba & Fuji Photo Film's Joint Development of Digital Still Camera System" Dempa Daily Newspaper, Mar. 24, 1989.

*Primary Examiner*—James J. Groody
*Assistant Examiner*—Kim Yen Vu
*Attorney, Agent, or Firm*—David M. Woods

[57] ABSTRACT

An electronic still camera employs digital processing of image signals corresponding to a still image and storage of the processed image signals in a removable static random access memory card. An image sensor is exposed to image light and the resultant analog image information is converted to digital image signals. A control processor controls the exposure section and the A/D converter, delivering digital signals to a multi-image buffer at a rate commensurate with normal operation of the camera. A digital processor operates on the stored digital signals, transforming blocks of the digital signals and encoding the signals into a compressed stream of processed image signals, which are downloaded to the memory card. The digital processor operates at a throughput rate different than the input rate for better image capture and optimum utilization of the camera.

18 Claims, 5 Drawing Sheets

ELECTRONIC STILL CAMERA UTILIZING IMAGE COMPRESSION AND DIGITAL STORAGE

BACKGROUND OF THE INVENTION

1. Field of the Invention

The present invention pertains in general to the field of electronic still imaging and, more particularly, to an electronic camera incorporating digital processing of image signals derived from an electronic image sensor and digital storage of the processed signals in a removable storage medium.

2. Description Relative to the Prior Art

An electronic still camera employing non-volatile storage of digital image signals is described in U.S. Pat. No. 4,489,351. Analog color information from three charge-coupled device (CCD) image sensors is converted into a digital bit stream and transmitted through a peripheral memory control unit to an integrated circuit memory. The memory is one unit of many, e.g., twenty-four memory units, recessed into a "cassette" that is separably attached through an electrical connector to the camera body. In order to obtain a digital image of high quality, many pixels, and thus many bits of digital information, need to be processed in a short time. In an article entitled "Possibilities of the Digital Electronic Still Camera", by Sumihisa Hashiguchi (*Shashin Kogaku*, pp. 110–111, Feb. 1988), the author proposes a multi-layer image processing integrated circuit including sensors, analog-to-digital (A/D) converters, and 8-bit buffer storage cells in respective layers. Since the output signal from an individual pixel is transferred "vertically" through an A/D converter to an included storage cell, real-time throughput is obtained without high speed operation. The stored signals can be read out slowly for digital recording, perhaps after compression, on a storage drive incorporating a small floppy disk. (Another example of a digital-based electronic still camera is shown in published UK Patent Application 2089169, in which the camera loads the digital image signals into a bubble memory cassette.)

A static random access memory (SRAM) card, in the size, and form, of a credit card, is an attractive storage alternative to the devices described in the above-related disclosures. For instance, published European Patent Application 289,944 shows a detachable SRAM module for use in a digital electronic still camera. The module is disclosed as a 32 M-bit (4 M-byte) SRAM integrated circuit card, although such storage capacities in a card are not commonly available at this time. A 512 K-byte SRAM card is presently available (Mitsubishi Electronics America, Inc. is one supplier). However, as pointed out in an article by Sumihisa Hashiguchi ("Picture Recording and Electric Power Consumption," *Shashin Kogvo*, pp. 94–95, Apr. 1988), there is a significant problem with memory volume. In the case, for example, of recording 780×490 picture elements from a CCD image sensor, with 8 bits allocated to each picture element, 382,200 bytes are required for a single monochrome video frame. This amounts to only one picture on a memory card (of 512 K-bytes). This is a considerable obstacle since still photographers are used to taking many pictures, e.g., 24 or 36 pictures, with one cassette of conventional film. Moreover, color pictures would ordinarily require three times the storage capacity of monochrome pictures.

Dynamic random access memory (DRAM) offers more storage in a reasonable volume, but power consumption quickly becomes formidable as storage capacity increases. The Hashiguchi article, consequently, calls for the development of new techniques of storage based on the compression of picture information by a factor of 10 or 100. As Hashiguchi points out, several picture compression techniques are available at present. For example, the aforementioned European Patent Application 289,944 suggests an embodiment in which a signal processor is adapted to accomplish data compression, such as the Hadamard transform, cosine transform or orthogonal transform, and coding on the video signal, which in turn is transferred to and stored interest that U.S. Pat. No. 4,131,919, which issued on Dec. 26, 1978, proposes the use of source and/or channel encoding schemes to more efficiently record digital still image signals on magnetic tape.) Adaptive differential pulse code modulation is another known compression algorithm for encoding still images.

The fundamental structure for in-camera digital processing is ordinarily based on a conventional analog camera, with digital processing techniques being applied to the functional analog blocks, such as color separation, white balance, gamma correction, and so on. This conventional transposition extends to real-time processing in that in-camera digital processing seeks, insofar as possible, to emulate real-time analog processing rates by rapidly accessing the imager, processing the resultant image signals, and writing the processed image signals to memory within normal video frame rates. (. . . albeit, that in the aforementioned *Shashin Kogaku* article of Feb. 1988, in U.S. Pat. No. 4,489,351, and in UK Patent Application 2089169, a buffer or temporary memory is provided to allow transmission of the image data to the recording device at a desired rate, which due to device or other limitations is often less than the image capture rate.) Nonetheless, as recognized by the Hashiguchi article, the available techniques neither adequately meet the requirement for real-time processing as needed by an electronic still camera nor the requirement for simply including the compression hardware with the camera.

SUMMARY OF THE INVENTION

The problem with the available techniques is their focus on real-time throughput. The present invention departs from this focus by distinguishing the input function of the camera from the processing function so that, on the one hand, image signals from a plurality of still images accumulate at a rate commensurate with normal operation of the camera while, on the other hand, the accumulated image signals are digitally processed at a throughput rate different than the accumulating rate. The prior techniques tend, by nature of their focus upon speed, not only to direct compression choices to those capable of handling a data stream at an extremely fast rate, such as differential pulse code modulation (DPCM), but also tend to focus processing upon one image at a time. By providing a multi-image input buffer and separating digital processing from input requirements, the digital processor not only has more time to operate on blocks of image signals, in particular transform encoding the blocks of signals, but also obtains such processing advantages without disturbing the "stacking up" of images in the input buffer. The invention further utilizes a removable digital storage means, such as a SRAM memory card, to store the compressed image signals. With 10:1 compression, for example, the byte requirement for a picture can be reduced by a factor of ten and many more images can be stored in the memory card.

BRIEF DESCRIPTION OF THE DRAWINGS

The invention will be described in relation to the drawings, in which.

DETAILED DESCRIPTION OF THE INVENTION

Because electronic still cameras employing charge-coupled device (CCD) sensors are well known, the present description will be directed in particular to elements forming part of, or cooperating more directly with, apparatus in accordance with the present invention. Elements not specifically shown or described herein may be selected from those known in the art.

Figure 1A:
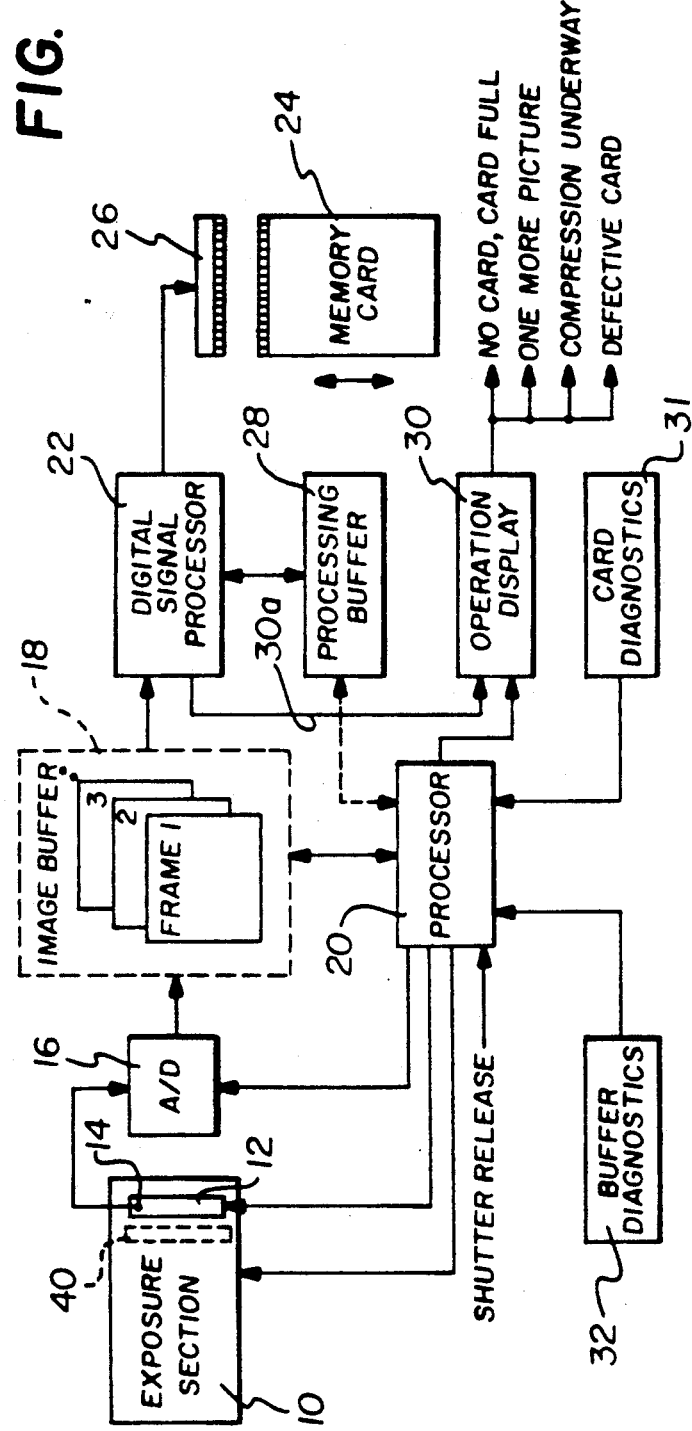
FIG. 1A is a block diagram of an electronic still camera employing digital processing according to the invention.
Figure 1B:
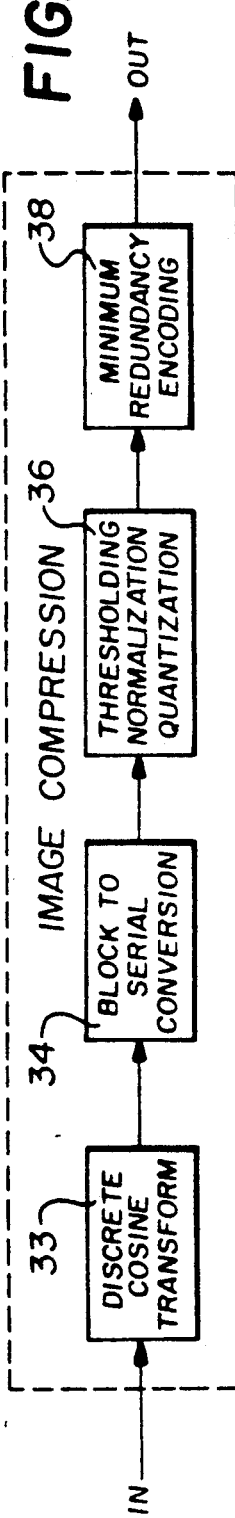
FIG. 1B is a block diagram of an exemplary form of image compression used in connection with the invention.

Referring initially to FIGS. 1A and 1B, an electronic still camera is divided generally into an input section 2 and a compression and recording section 4. The input section 2 includes an exposure section 10 for directing image light from a subject (not shown) toward an image sensor 12. Although not shown, the exposure section 10 includes conventional optics for directing the image light through a diaphragm, which regulates the optical aperture, and a shutter, which regulates exposure time. The sensor 12, which includes a two-dimensional array of photosites corresponding to picture elements of the image, is a conventional charge-coupled device (CCD) using either well-known interline transfer or frame transfer techniques. The sensor 12 is exposed to image light so that analog image charge information is generated in respective photosites. The charge information is applied to an output diode 14, which converts the charge information to analog image signals corresponding to respective picture elements. The analog image signals are applied to an A/D converter 16, which generates a digital image signal from the analog input signal for each picture element.

The digital signals are applied to an image buffer 18, which is a random access memory (RAM) with storage capacity for a plurality of still images. The arrangement for allocating memory space in the image buffer 18 to individual frames may vary; for this description, however, the frames will be allocated to specific, identifiable memory spaces such that a new frame can be directly written over an old frame without affecting the other frames in the buffer 18. This, as will be shown, becomes convenient in unloading the buffer 18 and freeing memory space for a new frame as soon as the older ones are processed.

A control processor 20 generally controls the input section 2 of the camera by initiating and controlling exposure (by operation of the diaphragm and shutter (not shown) in the exposure section 10), by generating the horizontal and vertical clocks needed for driving the sensor 12 and for clocking image information therefrom, and by enabling the A/D converter 16 in conjunction with the image buffer 18 for each signal segment relating to a picture element. (The control processor 20 would ordinarily include a microprocessor coupled with a system timing circuit.) Once a certain number of digital image signals have been accumulated in the image buffer 18, the stored signals are applied to a digital signal processor 22, which controls the throughput processing rate for the compression and recording section 4 of the camera. The processor 22 applies a compression algorithm to the digital image signals, and sends the compressed signals to a removable memory card 24 via a connector 26. A representative memory card is a 512 K-byte static random access memory (SRAM) available from Mitsubishi Corp.

Since the compression and related processing ordinarily occurs over several steps, the intermediate products of the processing algorithm are stored in a processing buffer 28. (The processing buffer 28 may also be configured as part of the memory space of the image buffer 18.) The number of image signals needed in the image buffer 18 before digital processing can begin depends on the type of processing, that is, for a block transformation to begin, a block of signals including at least a portion of the image signals comprising a video frame must be available. Consequently, in most circumstances, the compression may commence as soon as the requisite block, e.g., of 16×16 picture elements, is present in the buffer 18.

The input section 2 operates at a rate commensurate with normal operation of the camera while compression, which consumes more time, can be relatively divorced from the input rate. The exposure section 10 exposes the sensor 12 to image light for a time period dependent upon exposure requirements, for example, a time period between 1/1000 second and several seconds. The image charge is then swept from the photosites in the sensor 12, converted to a digital format, and written into the image buffer 18 during a standard rate, which may, for example, correspond to a standard video field or frame rate. The repetition rate of the driving signals provided by the control processor 20 to the sensor 12, the A/D converter 16 and the buffer 18 are accordingly generated to achieve such a transfer. The processing throughput rate of the compression and recording section 4 is determined by the character of an image, i.e., the amount of detail versus redundant information, and the speed of the digital signal processor 22, and may take up to several seconds for an especially complex image.

Figure 2A:
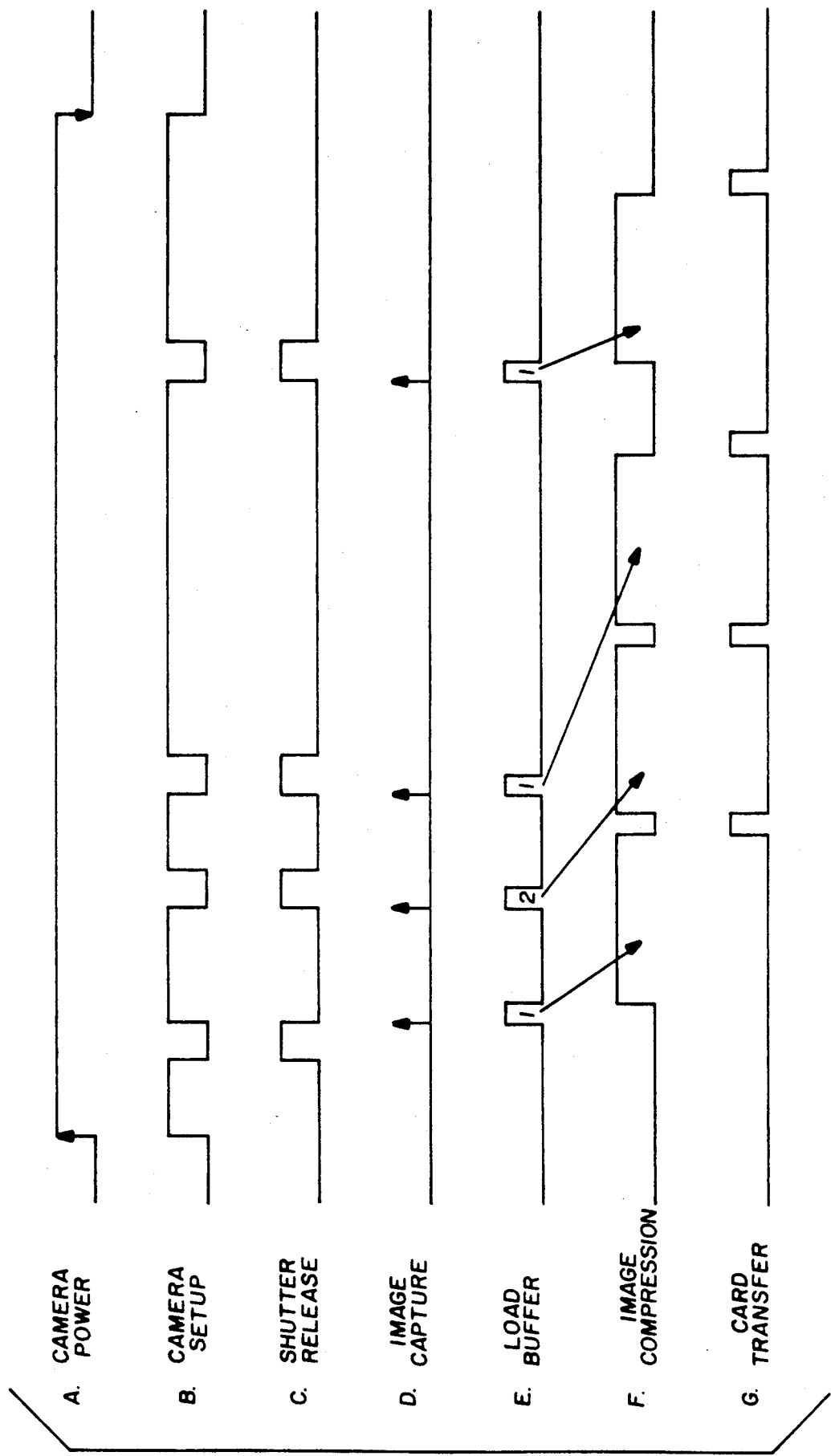
FIG. 2A is a functional sequence diagram showing multi-image input buffering.
Figure 2B:
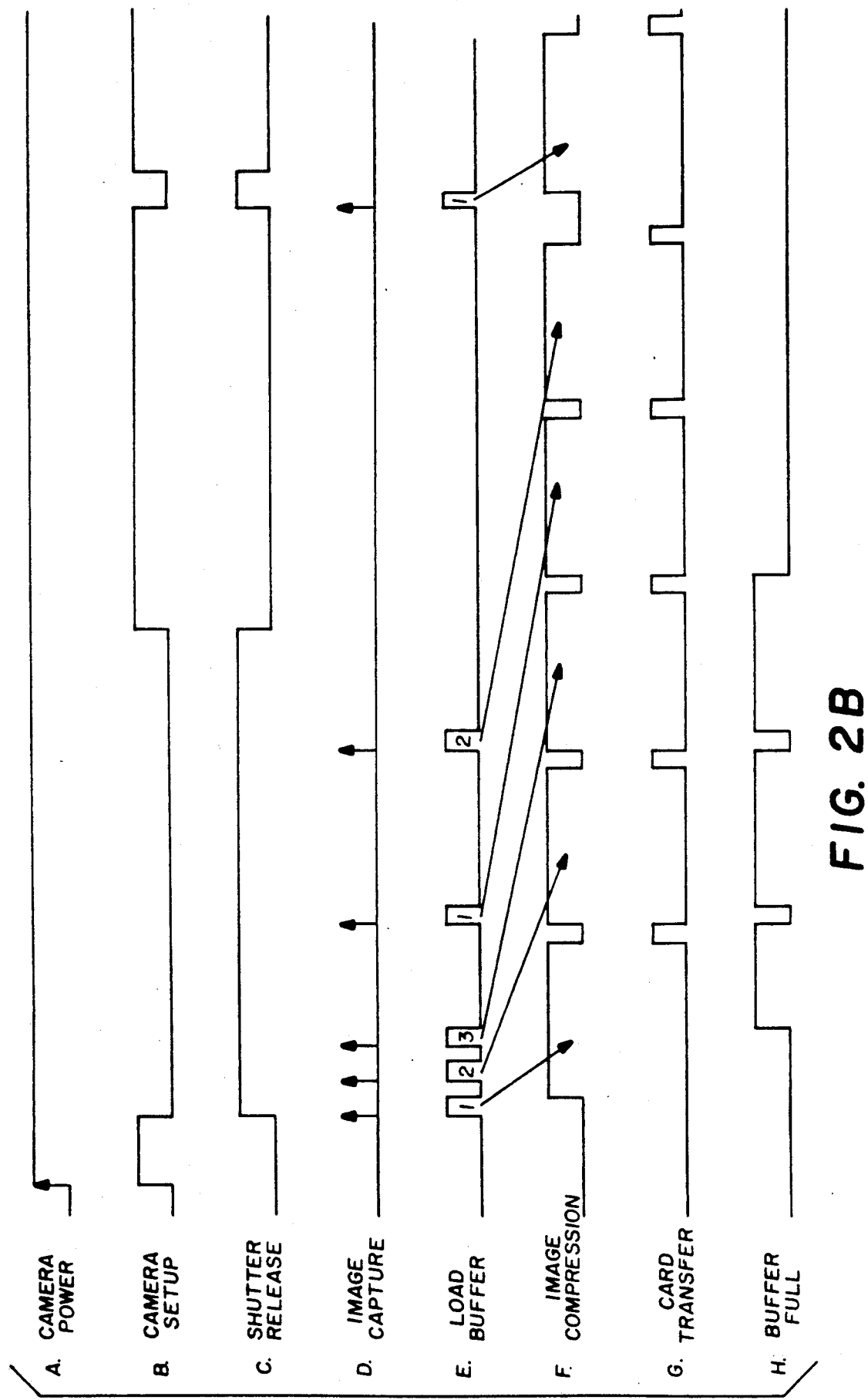
FIG. 2B is a further functional sequence diagram showing full utilization of the input buffer and concomitant delay.

One desirable consequence of this architecture is that the processing algorithm employed in the compression and recording section may be selected for quality treatment of the image rather than for throughput speed. This, of course, can put a delay between consecutive pictures which may affect the user, depending on the time between photographic events. This is a problem since it is well known and understood in the field of still video recording that a digital still camera should provide a continuous shooting capability for a successive sequence of images. For this reason, the image buffer 18 shown in FIG. 1 provides for storage of a plurality of images, in effect allowing a series of images to "stack up" at video rates. The size of the buffer is established to hold enough consecutive images to cover most picture-taking situations. FIGS. 2A and 2B show the typical functional sequence for a camera having buffer area for three separate images. As each image is captured (line D), the next available buffer area is loaded (line E) and image compression begins (line F). FIG. 2A illustrates a typical situation in which the shutter release (line C) is actuated at spaced times insufficient to load all three buffer areas. In FIG. 2B, the shutter release is continuously held down (line C) and a burst of exposures ensue. The three buffer areas are quickly loaded (line E) and, responsive to a buffer full signal (line H), the control processor 20 interrupts the exposure section 10. No further image is then captured until a buffer is freed. For example, in lines E and F, after the first image is compressed and transferred to the card 24, the first buffer area is freed up and a fourth exposure is made.

An operation display panel 30 is connected to the control processor 20 for displaying information useful in operation of the camera. Such information might include typical photographic data, such as shutter speed, aperture, exposure bias, color balance (auto, tungsten, fluorescent, daylight), field/frame, low battery, low light, exposure modes (aperture preferred, shutter preferred), and so on. Moreover, other information unique to this type of camera is displayed. For instance, the memory card 24 would ordinarily include a directory signifying the beginning and ending of each stored image. This would show on the display 30 as either (or both) the number of images stored or the number of image spaces remaining, or estimated to be remaining.

The control processor 20 also accesses a card diagnostics memory 31 for generating important information about the condition of the memory card 24. Specifically, the connector 26 is queried for the presence of a card 24 and, if no card is connected, a "no card" display is produced on the operation display 30. Likewise, if a card is present but it is full of images, a "card full" display is produced. The card diagnostics memory 31 also provides a verification routine to check the card 24 for faults or defects. For instance, a set of code patterns (such as 010101 . . . and 101010 . . . ) can be written into and read from the card to verify memory locations. This is especially important since compressed data is stored on the card 24 and even one defective memory location can produce an extensive visual artifact in the expanded picture. If a card 24 fails the verification test, a "defective card" display is produced on the operation display 30.

Buffer diagnostics are maintained in a memory 32 for producing certain information about the condition of the image buffer 18. Its principal purpose is to monitor the utilization of buffer space and produce, as shown in line H of FIG. 2B, a "buffer full" signal when no more buffer space is available. A corresponding display is produced on the display 30, which is important to the user as no further image can be captured until a buffer area is freed up. The digital signal processor 22 further provides a signal indicative of the compression operation on a line 30a to the operation display 30, that is, a signal indicating that compression is underway. A corresponding display, "compression underway", is activated by the display 30.

The digital signal processor 22 compresses each still video image stored in the image buffer 18 according to a known image compression algorithm shown in FIG. 1B. The compression algorithm begins with a discrete cosine transformation (block 33) of each successive block of the image data to generate a corresponding block of cosine transform coefficients. It is well-known that compression techniques are greatly enhanced when applied to image data which has been previously transformed in accordance with a discrete cosine transform algorithm. The cosine transform coefficients are then rearranged in serial order by a block-to-serial conversion step (block 34) described and illustrated in U.S. Pat. No. 4,772,956, "Dual Block Still Video Compander Processor," issued Sept. 20, 1988 to Roche et al., and which is assigned to the assignee of the present invention and incorporated by reference into the present patent application. The block-to-serial conversion step consists of arranging the discrete cosine transform coefficients in order of increasing spatial frequency, which corresponds to a zig-zag pattern illustrated in the Roche et al patent. The resulting serial string of transform coefficients is then subjected to thresholding, normalization, and quantization (block 36) and minimum redundancy encoding (block 38).

Thresholding discards data words of magnitudes less than a threshold number. Normalization entails dividing each data word by a divisor to yield a quotient. Quantization discards the fractional bits in the quotient. Minimum redundancy encoding is a technique well-known in the prior art and employs two complimentary steps, namely amplitude encoding and run length encoding. Amplitude encoding (or "Huffman Encoding") assigns to each of a finite set of possible amplitudes an encoded bit pattern designed to require the smallest number of bits for non-redundant representation. Run length encoding represents any consecutive run of zeros in the data as the smallest non-redundant bit pattern required to count the number of zeros in the run. The set of bit patterns representing each of the possible word amplitudes and the set of bit patterns representing each of the possible zero run lengths may be selected in accordance with the well-known principles and stored in look-up tables for use during the compression process. This compression technique greatly reduces the number of bits required to represent a frame of still video information, without reduction in image quality, thereby greatly reducing the amount of storage that must be allocated to each still frame in the SRAM card 24.

The uncompressed still video data stored in the image buffer 18 is organized in the manner of a television picture, that is, in vertical columns and horizontal rows of video data bytes (representing the corresponding picture elements) divisible into square blocks of bytes, each block comprising, e.g., 16 columns and 16 rows of bytes. The control processor 20 fetches a block of data each time the digital signal processor 22 is about to execute the compression algorithm. The compression process eliminates many bits contained in each block of video data, so that the compressed video data does not emerge from the processor 22 as a standard-length stream of bits, but as a variable number of bits dependent upon the complexity of the picture and the rules used for truncating bits. The memory space, therefore, allocated for each image in the SRAM card 24 can vary from image to image. The processor 22, consequently, allocates memory space in the SRAM card 24 after each compression sequence for an image is completed so that the images may be "packed" into the card as a continuum of compressed image data. This means the storage capacity, in terms of actual images, of the SRAM card is unknown in the beginning, and then gradually is specified as pictures are taken and the card is "filled". The control processor 20 monitors the numbers of images, furnishing a running total to the operation display panel 30, and further triggers a special "one more picture" display when the remaining memory space is sufficient for a predetermined number of, say one more, pictures. Alternatively, a fixed "maximum" space can be allocated in the SRAM card 24 for each image; in this case, fewer images can be stored although the total capacity is always known.

What has been described to this point applies equally to monochrome or color pictures, except that color pictures require additional processing. For instance, if a multi-spectral color filter array (shown in broken line 40 in FIG. 1A) overlies the image sensor 12, the various colors are sorted out and processed differently for each color. This would be accomplished by an additional routine in the digital signal processor 22. Such color filter array processing would precede the discrete cosine transform block 33 (FIG. 1B) so that image compression can be done separately on each color and three compressed frames would be stored in the memory card 24 for each image.

Figure 3:
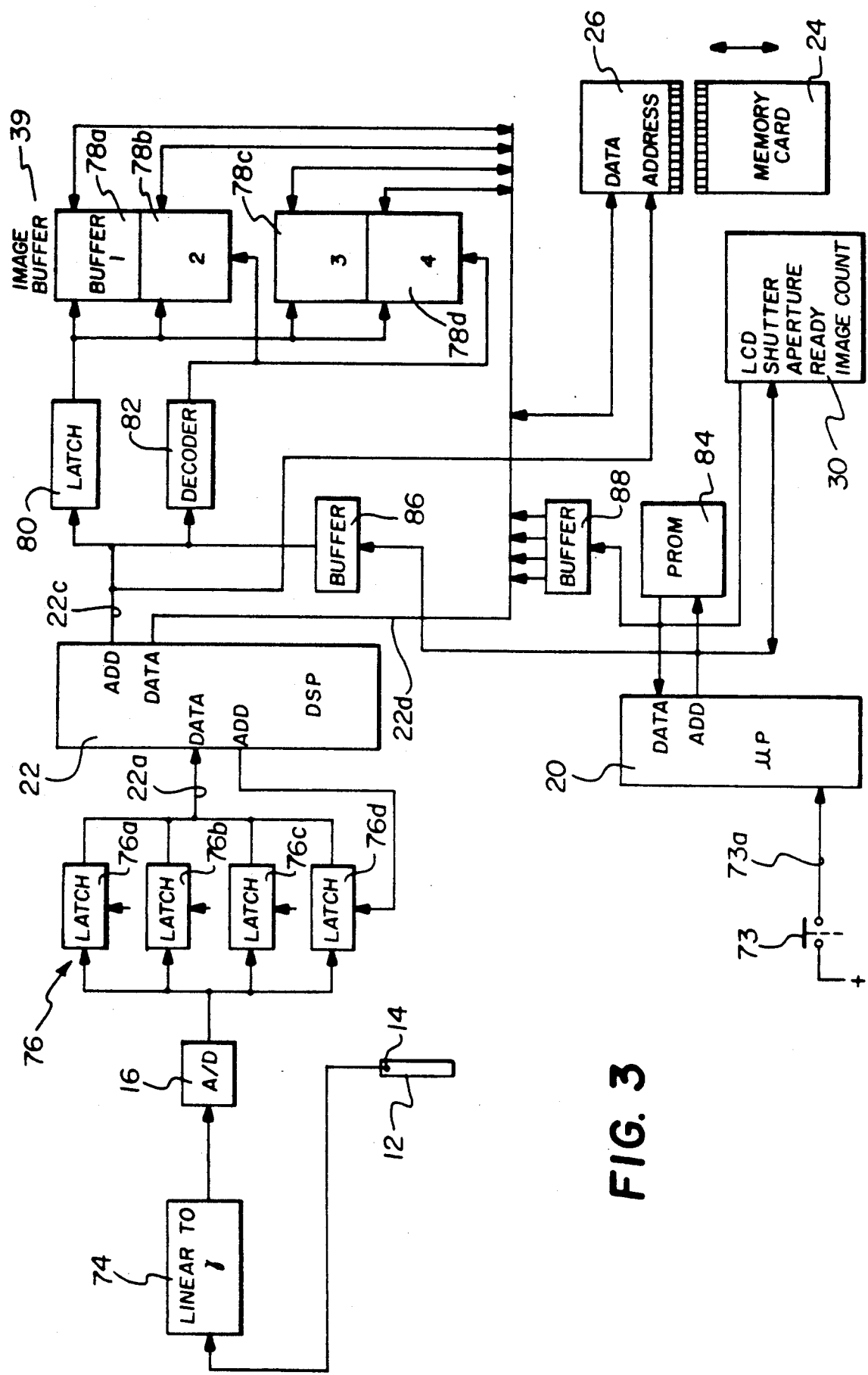
FIG. 3 is a block diagram showing details of a specific processing architecture for the electronic still camera.

FIG. 3 illustrates details of a specific processing architecture in which an image buffer 39 combines the function of the image buffer 18 and the processing buffer 28 shown in FIG. 1A. The analog signals from the output diode 14 of the image sensor 12 are gamma-corrected in a conventional linear-to-gamma correction circuit 74 and applied to the A/D converter 16. The output of the A/D converter 16 is connected to an 8 bit-to-32 bit latching array 76 comprising latches 76a, 76b, 76c, and 76d. In practice, the latching array 76 performs a double buffering operation to save time, that is, the latched bytes are unloaded in pairs to the processor 22 on a 32 bit-wide input data bus 22a, as follows. After latches 76a and 76b are loaded with the first two bytes provided by the A/D converter 16, the latched bytes are applied in parallel to the data bus 22a. In the meantime other two latches 76c and 76d are being loaded with the next two bytes. When the latches 76c and 76d are full, the latched bytes are applied in parallel to the input data bus 22a while the other latches 76a and 76b are being loaded with new bytes.

In this architecture, therefore, the digital signal processor 22 has the initial function, prior to compression, of transferring the paired input bytes to the image buffer 39, which includes random access memories (RAMs) 78a, 78b, 78c, and 78d. In terms of allocating bytes to storage, RAM 78a receives data from the latch 76a, RAM 78b from latch 76b, and so on. The digital signal processor 22 produces address words on an address bus 22c connected to the RAMs 78a–78d. The address word is held in an address latch 80 while a portion of the address word is decoded in a decoder 82 for activating the appropriate chip enable ports of the image buffer RAMs 78a–78d. As shown in FIG. 3, the buffer 39 is enabled in pairs of RAMs 78a–78d to correspond to the paired bytes being transferred from the latches 76a–76d.

The embodiment of FIG. 3 includes no resident non-volatile memory for the digital processor 22. Consequently, the operating program code for the camera is stored in a programmable read only memory (PROM) 84 connected to the address and data buses of the control processor 20. These bus lines are also connected, through respective buffers 86 and 88, to the output address bus 22c and the output data bus 22d of the digital processor 22. The control processor 20 downloads portions of the operating program from the PROM 84 to the image buffer 39 as required for operation of the digital processor 22. For instance, when a shutter release 73 is depressed and a line 73a is activated, the control processor 20 downloads the data acquisition code over the data bus 22d to a specified location in the image buffer 39. The appropriate address words are then applied to the address bus 22c by the control processor 20 and the operating code is written into volatile memory in the digital processor 22. The processor 22 is then ready to latch incoming image bytes into the latch array 76 and transfer paired bytes to the image buffer 39.

When all the image bytes of a still picture are in the image buffer 39, the control processor 20 downloads the operating code for the discrete cosine transform from the PROM 84 to a specified unused memory space in the image buffer 39. The DCT code is written into the volatile memory of the processor 22 and the discrete cosine transformation is performed on blocks of image bytes in the image buffer 39. After each block is transformed, the transform coefficients are written back into the image buffer 39. The control processor 20 next downloads the operating code for the block to serial conversion in like manner, the conversion is performed, and the serial string is written back into the buffer. Then the code for thresholding, normalization and quantization is downloaded in similar fashion, the processing done and processed data stored, and the code for minimum redundancy encoding is downloaded and the amplitude and run length encoding is done. With the image data now in its finally compressed form, and instead of writing the compressed data back into the buffer 39 one more time, the compressed data is directly written into the memory card 24. The above-related technique for storing the operating code in the PROM 84 and downloading sections thereof as needed conserves on the need for fast, and therefore expensive, non-volatile memory dedicated to the processor 22.

Figure 4A:
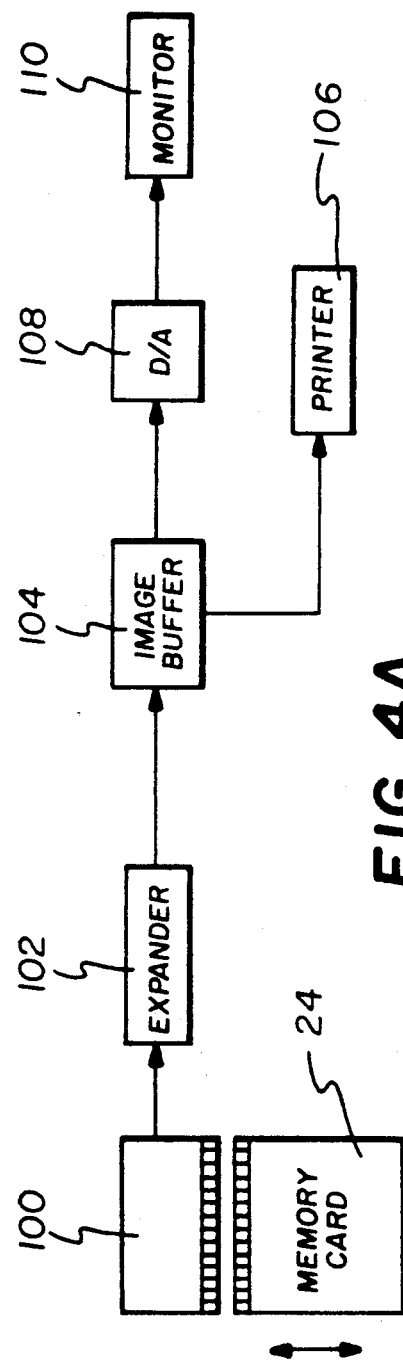
FIG. 4A is a block diagram of an electronic still player for use in reproducing pictures taken with the camera of FIG. 1A.
Figure 4B:
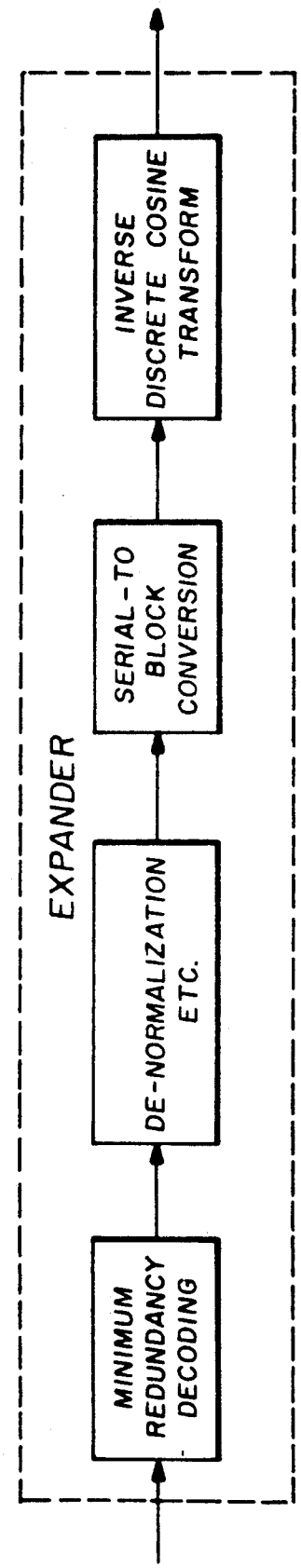
FIG. 4B is a block diagram of an exemplary form of image expansion used in connection with the player of FIG. 4A.

A simplified block diagram is shown in FIG. 4a of a still video player for reproducing a picture or for making a hard copy print from the digital image signals stored in compressed format in the memory card 24. With the card 24 inserted into a connector 100, the digital signals are accessed and processed in an expander 102. An expansion algorithm, which is basically the inverse of the compression algorithm of FIG. 1B, is shown in FIG. 4B and implemented by the expander 102. The digital image data is expanded block-by-block and stored in an image buffer 104 as a decompressed image. A conventional thermal printer 106 is connected to the buffer 104 for making a hard copy thermal print from the decompressed image. In addition, the decompressed image signals are converted to analog form by a digital-to-analog (D/A) converter 108 and displayed on a conventional CRT monitor 110.

The invention has been described in detail with particular reference to a presently preferred embodiment, but it will be understood that variations and modifications can be effected within the spirit and scope of the invention.

What is claimed is:

1. Electronic still imaging apparatus employing digital processing of image signals corresponding to a still image and storage of the processed image signals in a removable digital memory, said imaging apparatus including an area image sensor having a two-dimensional array of photosites corresponding to picture elements of the image and means for exposing said sensor to image light so that analog image information if generated in respective photosites, said imaging apparatus comprising:

means for converting the analog image information into digital image signals corresponding to the picture elements;

an image buffer with storage capacity for storing digital image signals corresponding to a plurality of still images;

control processor means responsive to user instructions for initiating operation of said exposing means, for clocking the image information from said sensor, and for controlling said converting means to deliver said digital signals to said image buffer, said control processor means loading digital image signals corresponding to said plurality of still images into said image buffer at an input rate commensurate with normal operation of the camera;

digital processing means for operating on blocks of stored digital image signals at a processing throughput rate different than said input rate, said digital processing means including means for transforming blocks of digital image signals into corresponding sets of transform coefficient signals and for encoding the transform coefficient signals into a compressed stream of processed digital image signals;

means responsive to said digital processing means for downloading the processed image signals to said removable digital memory; and diagnostic means for monitoring the utilization of said image buffer whereby information is generated as to the current condition of the image buffer.

2. The apparatus claimed in claim 1 in which said diagnostic means includes means for monitoring the remaining storage capacity of said image buffer.

3. The apparatus as claimed in claim 2 in which said diagnostic means includes means for providing a buffer full signal when said buffer is fully loaded.

4. The apparatus as claimed in claim 3 wherein said control processor means includes means responsive to said buffer full signal for interrupting said exposing means and preventing further exposure of said image sensor.

5. The apparatus as claimed in claim 3 further including a visual indicator and wherein said control processor means activates said visual indicator according to the state of said buffer full signal.

6. The apparatus as claimed in claim 1 in which said digital processing means further includes a processing buffer, said digital processing means operating on blocks of digital image signals before said image buffer is fully loaded and storing intermediate products of said processing in said processing buffer so that memory space is freed in said image buffer for further storage of new still images.

7. The apparatus as claimed in claim 1 which said digital processing means generates in operating signal indicating when the compression algorithm is operating.

8. The apparatus as claimed in claim 7 further including a visual indicator and wherein said control processor means activates said visual indicator according to the state of said operating signal.

9. The apparatus as claimed in claim 1 in which said digital processing means compresses the digital image signal in a plurality of stages, one stage including the performance of a discrete cosine transform on the blocks of image signals and another stage including minimum redundancy encoding of the transformed image signals.

10. An electronic still camera employing digital processing of image signals corresponding to a still image and storage of the processed image signals in a removable digital memory, said camera including an area image sensor having a two-dimensional array of photosites corresponding to picture elements of the image and means for exposing said sensor to image light so that analog image signals are obtained from the respective photosites, said camera comprising:

an A/D converter for converting the analog image signals into digital image signals;

a digital processor for processing the digital image signals through a compression algorithm and for generating a stream of compressed signals having a variable bit length dependent upon the character of the image, said processor allocating a variable-length memory space in said removable digital memory for each image;

means for downloading the compressed signals to the allocated image space such that consecutive memory spaces may differ in length depending on the character of each image; and means for generating a warning signal when the remaining unused memory space in said removable digital memory corresponds to a predetermined amount of memory space generally suitable for at least one more still image.

11. The camera as claimed in claim 10 further including a visual indicator and means for activating said visual indicator according to the state of said warning signal.

12. An electronic still camera employing digital processing of image signals corresponding to a still image and storage of the processed image signals in a removable digital memory, said camera including an area image sensor having a two-dimensional array of photosites corresponding to picture elements of the image and means for exposing said sensor to image light so that analog image signals are obtained from the respective photosites, said camera comprising:

an A/D converter for converting the analog image signals into digital image signals;

a random access image buffer having memory space sufficient for a plurality of still images;

control means responsive to repeated actuation of said exposing means for entering the digital image signals corresponding to a sequence of still images into said image buffer at a rate commensurate with normal operation of the camera, said control means intermittently disabling and reenabling said exposing means according to the memory space remaining in said random access image buffer;

a digital processor for compressing the digital image signals, said processor connected to said buffer for operating on stored digital signals from the first stored image irregardless of the entering of digital signals corresponding to subsequent still images into said buffer; and means responsive to said digital processor for downloading the compressed image signals to said removable digital memory.

13. The camera as claimed in claim 12 in which said digital processor operates a compression algorithm on blocks of stored digital signals corresponding to blocks of picture elements, said block compression operating irregardless of the entering of digital signals corresponding to further blocks of the same image.

14. Electronic still imaging apparatus employing digital processing of image signals corresponding to a still image and storage of the processed image signals in a removable digital memory, said imaging apparatus including an area image sensor having a two-dimensional array of photosites corresponding to picture elements of the image and means for exposing said sensor to image light so that analog image information is generated in respective photosites, said imaging apparatus comprising:

means for converting the analog image information into digital image signals corresponding to the picture elements;

an image buffer with storage capacity for storing digital image signals corresponding to a plurality of still images;

control processor means responsive to user instructions for initiating operation of said exposing means, for clocking the image information from said sensor, and for controlling said converting means to deliver said digital signals to said image buffer, said control processor means loading digital image signals corresponding to said plurality of still images into said image buffer at an input rate commensurate with normal operation of the camera;

digital processing means for operating on blocks of stored digital image signals at a processing throughput rate different than said input rate, said digital processing means including means for transforming blocks of digital image signals into corresponding sets of transform coefficient signals and for encoding the transform coefficient signals into a compressed stream of processed digital image signals;

means responsive to said digital processing means for downloading the processed image signals to said removable digital memory; and diagnostic means for checking the removable digital memory for faults or defects.

15. The apparatus as claimed in claim 14 in which said diagnostic means includes means for providing a defective card signal whenever the removable digital memory fails the check provided by said diagnostic means.

16. Electronic still imaging apparatus employing digital processing of image signals corresponding to a still image and storage of the processed image signals in a removable digital memory, said imaging apparatus including an area image sensor having a two-dimensional array of photosites corresponding to picture elements of the image and means for exposing said sensor to image light so that analog image information is generated in respective photosites, said imaging apparatus comprising:

means for converting the analog image information into digital image signals corresponding to the picture elements;

an image buffer for storing one or more blocks of digital image signals corresponding to portions of a still image;

control processor means responsive to user instructions for initiating operation of said exposing means, for clocking the image information from said sensor, and for controlling said converting means to deliver said digital signals to said image buffer;

digital processing means for operating on each block of stored digital image signals, said digital processing means including means for transforming each block of digital image signals into corresponding sets of transform coefficient signals and for encoding the transform coefficient signals into a compressed stream of processed digital image signals;

diagnostic means for checking the removable digital memory for faults or defects and for providing an indication thereof; and means responsive to said digital processing means and to said indication from said diagnostic means for downloading the processed image signals to said removable digital memory.

17. The apparatus as claimed in claim 16 in which said diagnostic means includes means for providing a defective card warning signal whenever the removable digital memory fails the check provided by said diagnostic means.

18. Electronic still imaging apparatus employing digital processing of image signals corresponding to a still image and storage of the processed image signals in a removable digital memory, said imaging apparatus including an area image sensor having a two-dimensional array of photosites corresponding to picture elements of the image and means for exposing said sensor to image light so that analog image information is generated in respective photosites, said area image sensor including a color filter array having a multi-colored pattern oriented to said photosites and including one color representative of luminance, said imaging apparatus comprising:

means for converting the analog image information into digital image signals corresponding to the picture elements;

an image buffer with storage capacity for storing digital image signals corresponding to a plurality of still images;

control processor means responsive to user instructions for initiating operation of said exposing means, for clocking the image information from said sensor, and for controlling said converting means to deliver said digital signals to said image buffer, said control processor means loading digital image signals corresponding to said plurality of still images into said image buffer at an input rate commensurate with normal operation of the camera;

digital processing means for operating on blocks of stored digital image signals at a processing throughput rate different than said input rate, said digital processing means including means for transforming blocks of digital image signals into corresponding sets of transform coefficient signals and for encoding the transform coefficient signals into a compressed stream of processed digital image signals, said digital processing means interpolating at least the luminance component over the block area and transforming each block of digital signals including the interpolated signals; and means responsive to said digital processing means for downloading the processed image signals to said removable digital memory.

* * * * *

UNITED STATES PATENT AND TRADEMARK OFFICE
CERTIFICATE OF CORRECTION

PATENT NO. : 5,016,107
DATED : May 14, 1991
INVENTOR(S) : S. Sasson, R. Hills

It is certified that error appears in the above-identified patent and that said Letters Patent is hereby corrected as shown below:

Column 9, line 8    Page 18, line 10    "if" should read --is--

Column 9, line 66   Page 19, line 34    "in" should read --an--

Signed and Sealed this

Tenth Day of November, 1992

*Attest:*

DOUGLAS B. COMER

*Attesting Officer*   Acting Commissioner of Patents and Trademarks